(12) United States Patent
Bang et al.

(10) Patent No.: US 11,990,270 B2
(45) Date of Patent: May 21, 2024

(54) BUS BAR FOR MINIMIZING AC LOSS IN TRANSFORMER AND METHOD OF DESIGNING THE SAME

(71) Applicant: HYUNDAI MOBIS Co., Ltd., Seoul (KR)

(72) Inventors: Tae Ho Bang, Seoul (KR); Deok Kwan Choi, Yongin-si (KR); Won Gon Kim, Yongin-si (KR); Min Heo, Seongnam-si (KR); Ji Hoon Park, Suwon-si (KR); Kang Min Kim, Seoul (KR); A Ra Lee, Seongnam-si (KR); Hyun Woo Shim, Suwon-si (KR); Du Ho Kim, Suwon-si (KR); Soo Min Jeon, Yongin-si (KR)

(73) Assignee: HYUNDAI MOBIS CO., LTD., Seoul (KR)

(*) Notice: Subject to any disclaimer, the term of this patent is extended or adjusted under 35 U.S.C. 154(b) by 290 days.

(21) Appl. No.: 17/533,586

(22) Filed: Nov. 23, 2021

(65) Prior Publication Data
US 2022/0165490 A1 May 26, 2022

(30) Foreign Application Priority Data
Nov. 23, 2020 (KR) .................. 10-2020-0158122

(51) Int. Cl.
*H01F 38/32* (2006.01)
*H01F 27/42* (2006.01)

(52) U.S. Cl.
CPC ............ *H01F 27/427* (2013.01); *H01F 38/32* (2013.01)

(58) Field of Classification Search
CPC ...... H01F 27/422; H01F 27/427; H01F 38/32; H01F 27/42
See application file for complete search history.

(56) References Cited

U.S. PATENT DOCUMENTS

| | | | |
|---|---|---|---|
| 8,080,900 B2 * | 12/2011 | Corhodzic | H02M 3/335 307/64 |
| 11,557,426 B2 * | 1/2023 | Grueso | H01F 27/32 |
| 2019/0341186 A1 * | 11/2019 | Wambsganss | H01F 30/04 |
| 2022/0247305 A1 * | 8/2022 | Kim | H05K 7/20 |
| 2023/0268728 A1 * | 8/2023 | Katayama | H02G 5/10 174/68.2 |

* cited by examiner

*Primary Examiner* — Adolf D Berhane
(74) *Attorney, Agent, or Firm* — Morgan, Lewis & Bockius LLP

(57) ABSTRACT

An aspect of the present disclosure provides a bus bar as a winding in a core of a transformer includes multiple sub-bars arranged horizontally and connected in parallel so as to minimize an AC current in the transformer, and the sub-bars have different widths and thus resistances or impedances with respect to a current flowing through the sub-bars are the same. Another aspect of the present disclosure provides a method of designing a bus bar for resistance or impedance matching between multiple sub-bars included in the bus bar to share a current to minimize an AC current in the transformer. Another aspect of the present disclosure provides a transformer, for a DC-DC converter for use in a vehicle, which is manufactured by the method of designing a bus bar.

11 Claims, 7 Drawing Sheets

ND METHOD OF
BUS BAR FOR MINIMIZING AC LOSS IN TRANSFORMER AND METHOD OF DESIGNING THE SAME

CROSS-REFERENCE TO RELATED APPLICATIONS

This application claims the benefit under 35 U.S.C. § 119(a) of Korean Patent Application No. 10-2020-0158122, filed on Nov. 23, 2020 in the Korean Intellectual Property Office, the entire disclosure of which is incorporated herein by reference for all purposes.

BACKGROUND

1. Field of the Invention

The present disclosure relates to a transformer and, more particularly, a bus bar of a transformer of a low-voltage DC-DC converter (LDC) for use in a vehicle.

2. Discussion of Related Art

A low-voltage DC-DC converter (LDC) used in eco-friendly vehicles (HEV, PHEV, EV, etc.) is a key component for recharging a low-voltage auxiliary battery that supplies power from high voltage to an electric power system of a vehicle. The LDC includes a transformer for conversion of high-voltage power of e.g., 200 to 400 V into low-voltage power of e.g., 12V. Generally, in a low-voltage high-current transformer, high current flows through a winding of small turns, e.g., about one to two turns, at a low-voltage side and thus a bus bar is used to accommodate the winding.

FIGS. 1A and 1B are configuration diagrams of a transformer for an LDC according to an embodiment provided to describe a bus bar. FIG. 1A illustrates a basic structure of a transformer in which a primary winding and a secondary winding are provided between an upper core 400 and a lower core 300. Here, a primary side refers to a high-voltage input and a secondary side refers to a low-voltage output. A wire is used as the primary winding 110 (only a terminal of the wire is partially shown in FIG. 1A), and a bus bar 220 is used as the secondary winding. FIG. 1B is an exploded view of the transformer, in which the cores 300 and 400, the winding 110 at an input side, and the bus bar 220 at an output side. The upper core 300 and the lower core 400 are E-shaped cores respectively having center legs 310 and 410 at a center. The input side, i.e., the primary winding 110 is configured by winding a wire about a bobbin 121. As the output side, i.e., the secondary winding, the bus bar 220 is configured by winding a single metal plate in approximately two turns.

Generally, in a transformer, conduction loss may occur in a winding due to a current, and is broadly classified as DC loss and AC loss. In general, a conduction loss due to a current may be expressed by the following equation consisting of a current and a winding resistance.

$W = I^2 * R$ ($W$: conduction loss, $I$: current of a winding, and $R$: resistance of a winding)

Here, the current of the winding may be classified into an AC current and a DC current, and unlike the DC current flowing through an entire cross-sectional area of the winding, the AC current flows through only a surface of the winding, and a depth from the surface of the winding to which a current may flow may vary according to a frequency. That is, a cross-sectional area through which the AC current may flow is smaller than that through which the DC current may flow. Therefore, a loss due to the AC current depends largely on the configuration of the winding, and generally, in order to reduce a loss due to the AC current, a Litz wire is used instead of a general winding or an entire surface area of the wiring is increased using various methods. Particularly, because a high current flows through a bus bar with a small number of turns, which is used at a low-voltage side of an LDC transformer for use in a vehicle, the amount of AC loss as described above is large and thus a method of reducing the AC loss is needed.

SUMMARY OF THE INVENTION

The present disclosure is directed to a winding or a bus bar structure capable of minimizing AC loss occurring in the wind or a bus bar within the same core size and being manufactured at low costs, and a method of designing the same.

An aspect of the present disclosure provides a bus bar provided as a winding in a core of a transformer and including multiple sub-bars arranged horizontally and connected in parallel in order to minimize AC loss of the transformer, wherein the multiple sub-bars have different widths and thus resistances or impedances with respect to a current flowing through the multiple sub-bars are the same.

Another aspect of the present disclosure provides a method of designing a bus bar for resistance or impedance matching between multiple sub-bars included in the bus bar to share a current to minimize an AC current in the transformer. The method of designing a bus bar of a transformer includes: (1) calculating a height H of the bus bar and a length L1 of a center sub-bar, which is an innermost sub-bar, in a space of the core; (2) setting an initial width W1 of the center sub-bar; (3) calculating a width W2 of a subsequent sub-bar adjacent to the center sub-bar; (4) calculating up to a width WN of an $N^{th}$ sub-bar while checking whether "a sum of widths of the sub-bars, distances between the sub-bars, and a distance G to a structure<a width CW of the core" (i.e., SUM[W1+W2+ . . . +WN+G*(N+1)]<CW), wherein when SUM[W1+W2+ . . . +WN+G*(N+1)]<CW, this operation (4) is continuously performed; (5) when it is determined in operation (4) that SUM[W1+W2+ . . . +WN+G*(N+1)]>CW, calculating an AC loss with respect to the bus bar including the calculated sub-bars, excluding the $N^{th}$ sub-bar calculated last; (6) repeatedly performing operations (1) to (5) while changing the initial width W1 by a predetermined rate of change ΔW1 until the initial width W1 of the center sub-bar becomes equal to an allowable minimum value W1_min; and (7) when the initial width W1 of the center sub-bar becomes equal to the allowable minimum value W1_min, ending the method and finally determining the bus bar to include sub-bars corresponding to a minimum value among AC losses obtained by repeated calculation.

Another aspect of the present disclosure provides a transformer, for a DC-DC converter for use in a vehicle, which is manufactured by the method of designing a bus bar.

The configuration and operations of the present disclosure will be more apparent through concrete embodiments described below in conjunction with the accompanying drawings.

BRIEF DESCRIPTION OF THE DRAWINGS

The above and other objects, features and advantages of the present disclosure will become more apparent to those of ordinary skill in the art by describing exemplary embodiments thereof in detail with reference to the accompanying drawings, in which:

FIGS. 5A, 5B, and 6 are diagrams for describing a method of designing a bus bar according to the present disclosure, in which FIG. 5A illustrates parameters considered in the case of sub-bars of a bus bar, FIG. 5B illustrates a spatial specification of a core, and FIG. 6 is a flowchart.

DETAILED DESCRIPTION OF EXEMPLARY EMBODIMENTS

Advantages and features of the present disclosure and methods of achieving them will be apparent from the following description of embodiments in conjunction with the accompanying drawings. The present disclosure is not limited to embodiments set forth herein and may be embodied in many different forms. These embodiments are provided so that this disclosure will be thorough and complete and will fully convey the concept of the present disclosure to those of ordinary skill in the art, and the scope of the present disclosure should be defined by the claims. The terminology used herein is for the purpose of describing particular embodiments only and is not intended to be limiting of the present disclosure. As used herein, singular forms are intended to include plural forms unless the context clearly indicates otherwise. As used herein, the terms "comprise" or "comprising" specify the presence of stated components, steps, operations and/or elements but do not preclude the presence or addition of one or more other components, steps, operations and/or elements. Hereinafter, embodiments of the present disclosure will be described in detail with reference to the accompanying drawings. In the following description of embodiments, well-known functions or constructions are not described in detail when it is determined that they would obscure the present disclosure due to unnecessary detail.

Figure 2A:
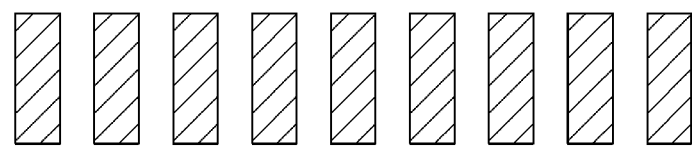
FIGS. 2A TO 2C illustrate various examples of a configuration of a bus bar applied in the related art to reduce an alternating-current (AC) loss.
Figure 2B:
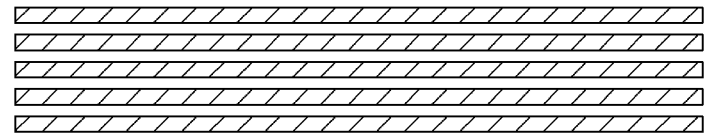
Figure 2C:
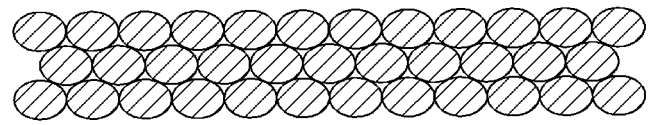

FIGS. 2A to 2C illustrate various examples of a configuration of a bus bar applied in the related art to reduce an alternating-current (AC) loss. In order to allow a high current to flow in different directions, a bus bar is divided into multiple sub-bars and the multiple sub-bars are connected in parallel (FIGS. 2A, 2b) or a Litz wire is used to handle a high current.

FIG. 2A: A sub-bar horizontal arrangement: a method of configuring a bus bar by arranging multiple sub-bars horizontally and connecting both ends of the multiple sub-bars by soldering. This method is advantageous in terms of heat dissipation because sub-bars are arranged on the same plane and thus may be entirely and relatively uniformly cooled through a single cooling channel. However, the lengths of current paths of the sub-bars are different, thus causing a resistance (or impedance) difference, and therefore, current imbalance (a phenomenon that when conducting wires diverge in multiple directions, a current is biased to one side due to the difference in a resistance between the conducting wires) may occur, as will be describe below. To solve this problem, windings may be connected in a mesh form, but in this case, costs and AC loss inevitably increase.

FIG. 2B: A sub-bar vertical arrangement: a method of configuring a bus bar by arranging multiple sub-bars vertically and connecting both ends of the multiple sub-bars by soldering. This method is advantageous in that unlike the bus-bar horizontal arrangement, sub-bars may be designed to have the same length and thus resistances (or impedances) of current paths are the same. However, this method is disadvantageous in that a distance to a cooling path is not uniform due to the difference between the positions (heights) of an upper sub-bar and a lower sub-bar and thus the sub-bars may not be uniformly cooled (particularly, in the case of the upper sub-bar), thereby reducing heat dissipation performance.

FIG. 2C: A method of configuring a low-voltage side winding with a Litz wire. This method is advantageous in that an AC loss can be minimized. However, the Litz wire is the most expensive material among materials of a winding.

Figure 1A:
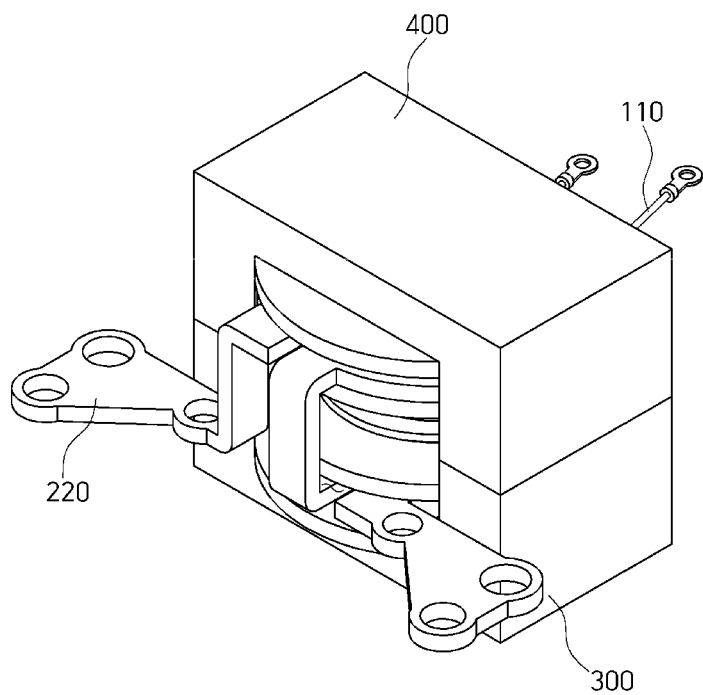
FIGS. 1A and 1B are configuration diagrams of a transformer for a low-voltage DC-DC converter (LDC) according to an embodiment provided to describe a bus bar.
Figure 1B:
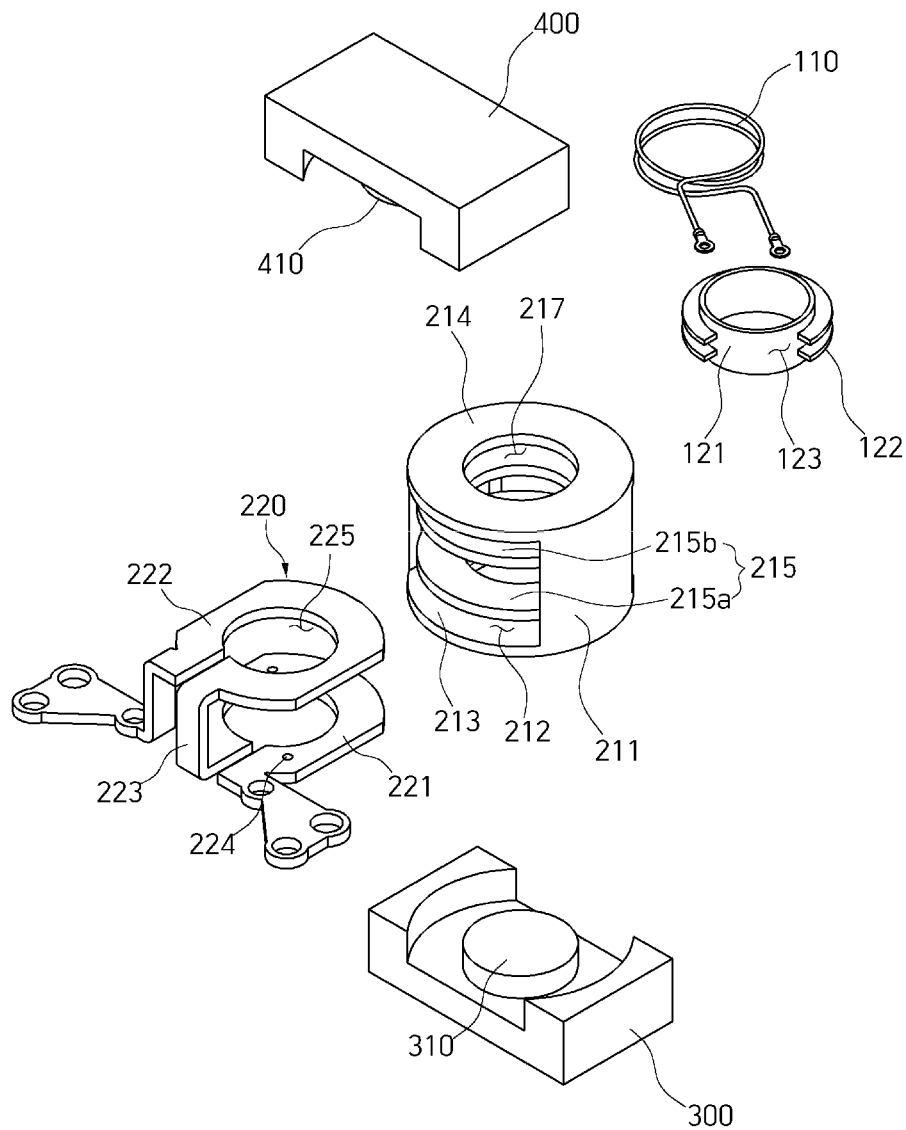
Figure 3:
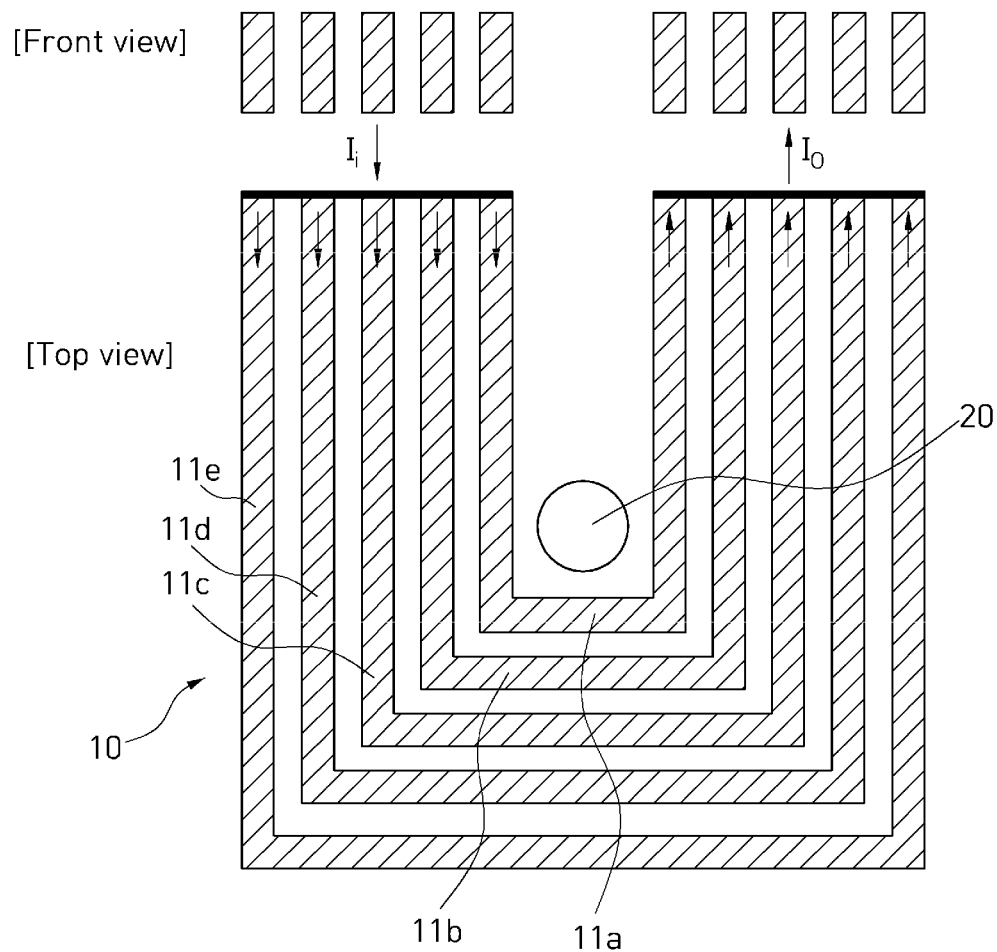
FIG. 3 is an explanatory drawing of a sub-bar horizontal arrangement method of (a) of FIG. 2, in which an upper part is a front view and a lower part is a top view.

FIG. 3 is a detailed explanatory drawing of the sub-bar horizontal arrangement method of FIG. 2A. FIG. 3 is a diagram illustrating an example of a configuration of a bus bar 10 configured by arranging multiple sub-bars 11a to 11e horizontally, and an upper part is a front view and a lower part thereof is a top view. FIG. 3 illustrates an embodiment in which several sub-bars 11a to 11e are horizontally arranged in a U shape to form a winding of a bus bar in one turn. A reference number 20 shown at a midpoint on the drawing denotes a center leg of an E-core (see 310 and 410 in FIG. 1B). Although not shown in FIG. 3, both ends of the sub-bars 11a to 11e are bonded together by soldering so that an input current Ii may be supplied at once and diverge in different directions through the sub-bars 11a to 11e, and thereafter an output current Io may be output at once.

As described above, when the bus bar 10 is configured by arranging the sub-bars 11a to 11e horizontally to reduce an AC loss and dissipate heat, all of the sub-bars 11a to 11e are provided at the same plane and thus may be uniformly cooled through a cooling channel on the bottom of a transformer.

However, as shown from the plan view of FIG. 3, the sub-bars 11a to 11e of the bus bar 10 are different in length. That is, the innermost sub-bar 11a is shortest and an outermost sub-bar 11e is longest because the lengths of the sub-bars 11a to 11e increase toward an outer side. Therefore, a resistance (or impedance) difference may occur due to the difference in length between the sub-bars 11a to 11e and thus the current Ii supplied to each of the bus bar 10 and the output current Io output through each of the bus bar 10 are not uniform, thus causing current imbalance. Although a bus bar is configured by arranging multiple sub-bars to reduce an AC loss, a new problem may occur due to the current imbalance.

Figure 4:
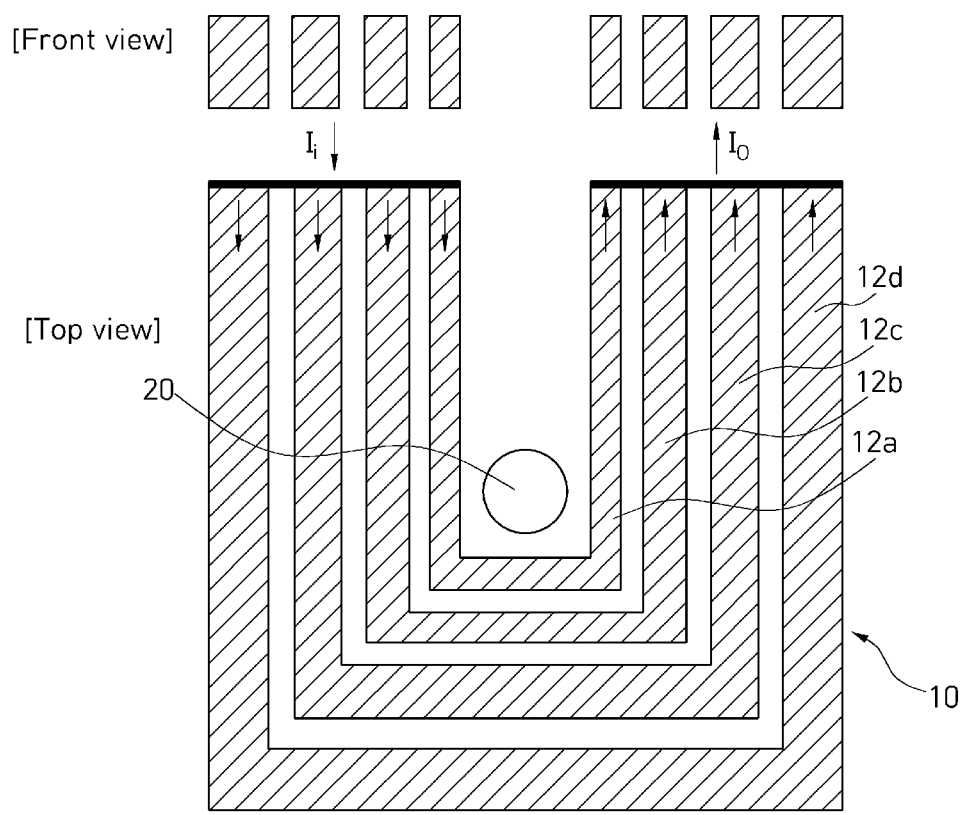
FIG. 4 illustrates a configuration of a bus bar according to the present disclosure proposed to overcome the conventional problem of a sub-bar horizontal arrangement.

FIG. 4 illustrates a configuration of a bus bar according to an embodiment of the present disclosure proposed to overcome the problem of the sub-bar horizontal arrangement.

Current imbalance may be solved by designing widths of current paths, i.e., widths of sub-bars 12a to 12d, to be different from one another to eliminate the difference between resistances or impedances of the current paths. The widths of sub-bars 12a to 12d may be designed to be different from one another by a sub-bar impedance matching method according to the present disclosure to be described below.

Figure 5A:
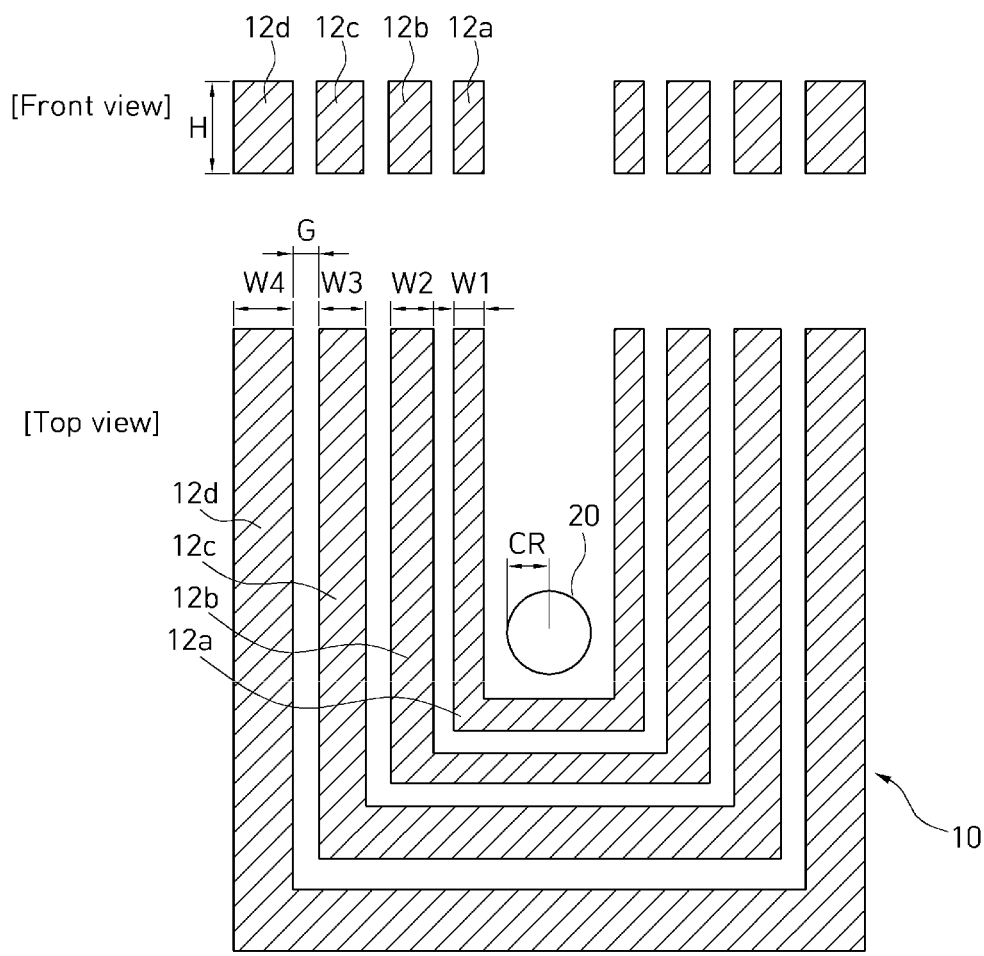
Figure 5B:
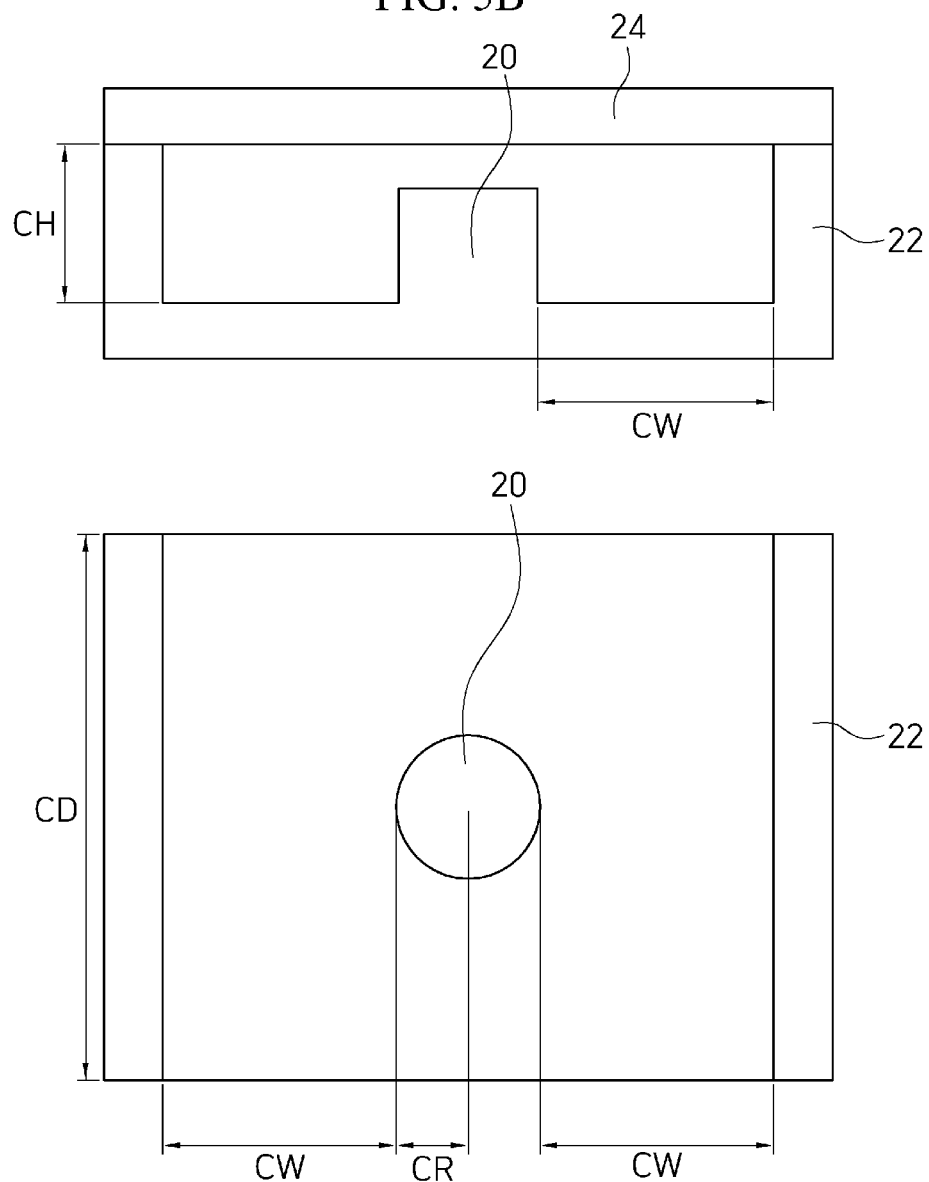
Figure 6:
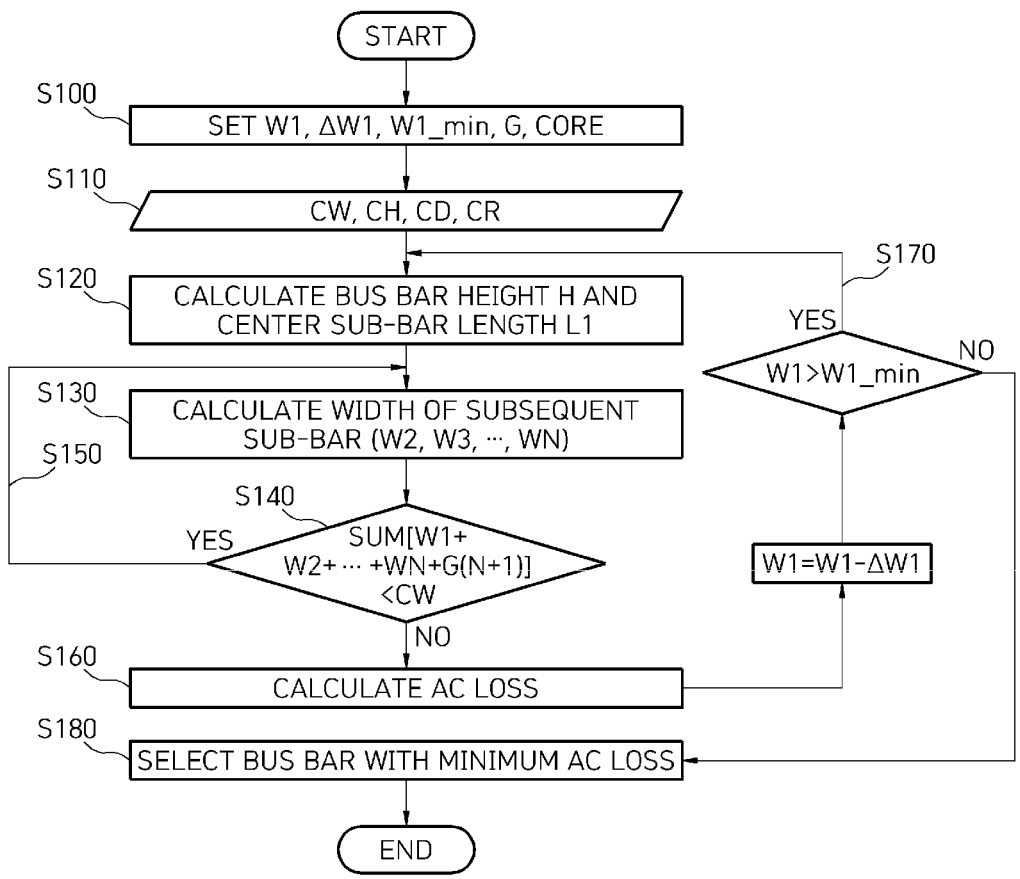

FIGS. 5A, 5B and 6 are diagrams and a flowchart of a method of determining a width and height of each sub-bar for impedance matching of current paths of sub-bars according to the present disclosure.

First, parameters to be used in the method of determining a width and height of each sub-bar for impedance matching are defined in FIGS. 5A and 5B. In FIG. 5A, H denotes a height (same height) of the sub-bars 12a to 12d, W1 denotes a width of a center (centermost) sub-bar 12a, W2 denotes a width of a subsequent outer sub-bar 12b, W3 denotes a width of a next outer sub-bar 12c, W4 denotes a width of the outermost sub-bar 12d, G denotes a distance (same distance) between the sub-bars 12a to 12d or between a core and another structure, and CR denotes a radius of a center leg of the core.

In FIG. 5B, CW denotes a width of the core, i.e., the distance between one leg of a lower core 22 and a center leg 20 or between another leg of the lower core 22 and the center leg 20 (generally, this space is called a window). CH denotes a height of an inner space formed by an upper core 24 and the lower core 22, and CD denotes a length of the core as shown in a lower part of FIG. 5B. Because a bus bar should be physically located in a space formed by the parameters CD, CW, and CH, these parameters of the space of the core should be considered in determining a width and height of each sub-bar of the bus bar.

A method of designing a bus bar according to the present disclosure will now be described with reference to the flowchart of a method of determining a specification of sub-bars through impedance matching illustrated in FIG. 6.

First, an initial width W1 of the center sub-bar 12a, a rate $\Delta W1$ of change of a width of the center sub-bar 12a, a minimum value W1_min of the center sub-bar 12a, the distance G between the sub-bars 12a to 12d, and a core of a transformer are set (S100). Here, the rate $\Delta W1$ of change of the width of the center sub-bar 12a refers to a rate by which the initial width W1 of the center sub-bar 12a is sequentially changed to a smaller value to determine an optimal width of the center sub-bar 12a. The minimum value W1_min of the center sub-bar 12a refers to a limit value that cannot reduced to a smaller value any more when an optimal width of the center sub-bar 12a is determined by sequentially reducing the width of the center sub-bar 12a by $\Delta W1$. In operation S100, the initial width W1 is selected as a larger value as possible (which is adjusted in a subsequent operation in consideration of a specification of a core). The minimum value W1_min is calculated by a current equation used in operation S120 to be described below when a maximum height H is determined by the height CH of the core.

Next, a spatial specification of the core, i.e., a width (window) CW, a height CH and a length CD of the core and a radius CR of a center leg are input (S110). However, the spatial specification of the core may be input as a specification of the core in advance when the core is selected in operation S100. For the spatial specification of the core, the size of a winding, i.e., a core space in which a bus bar according to the present disclosure is to be actually placed, should be considered when the bus bar of the present disclosure is designed.

After the height H of the bus bar is calculated, a length L1 of the center sub-bar 12a is calculated (S120). The height H of the bus bar may be determined by a current (i.e., the sum of the amounts of current flowing through all sub-bars) flowing through the bus bar. That is, because I=H*W*current density, H=F(W*current density) (I: an average amount of current flowing through the bus bar, H: a height of the bus bar(=a height of sub-bar), and W: a width of the bus bar). The length L1 of the center sub-bar 12a is determined by the length CD of the core and the radius CR of the center leg. That is, L1=CD+4*CR+2*W1.

A width W2 of a subsequent sub-bar is calculated by the following equation (S130). First, a length L2 of a second sub-bar may be expressed as (L1+2*W1+4*G+2*W2). The width W2 is calculated by putting the equation for the length L1 and the equation for the length L2 into an equation of $R=\rho*L1/(W1*H)=\rho*L2/(W2*H)$ (here, $\rho$: resistivity of a conducting wire).

The equation $R=\rho*L[N-1]/(W[N-1]*H)=\rho*LN/(WN*H)$ is used to calculate up to a width WN of an $N^{th}$ sub-bar (S130) while checking whether "sum of the width of each sub-bar, the distance between the sub-bars, and the distance to a structure<width CW of the core" (i.e., SUM[W1+W2+ . . . +WN+G*(N+1)<CW) (S140). In operation S140, the reason why "G*(N+1)" is because the number of gaps G to the structure (i.e., an inner wall of the core 22, and the center leg 24) within the core window CW is N+1.

Specifically, when it is determined in operation S140 that SUM[W1+W2+ . . . +WN+G*(N+1)]<CW (S150), the bus bar may be continuously accommodated in the window CW of the core and thus operation S130 is performed again. When not SUM[W1+W2+ . . . +WN+G*(N+1)]>CW, the bus bar is larger than the space of the window CW of the core and the number of sub-bars to be included in the bus bar may be determined to be (N−1), excluding the $N^{th}$ sub-bar calculated last. However, when SUM[W1+W2+ . . . +WN+G*(N+1)]=CW, the bus bar may be placed in the space of the window CW of the core with the smallest distance G and thus it is not necessary to exclude the Nth sub-bar calculated last. Next, operation S160 is performed in which an AC loss is calculated on the basis of the shape of the bus bar with the sub-bars calculated until now.

After the AC loss is calculated (S160), operations S120 to S160 are repeatedly performed while reducing the initial width W1 of the center sub-bar 12a by a certain rate of change, i.e., the rate $\Delta W1$ selected above, until the initial width W1 of the center sub-bar 12a becomes equal to the allowable minimum value W1_min (S170). That is, the process is repeatedly performed while changing the width of each sub-bar of the configured bus bar for which an AC loss is calculated in operation S160, until a pattern of a bus bar with an optimal AC loss is achieved.

Lastly, when the initial width W1 of the center sub-bar 12a becomes equal to the allowable minimum value W1_min and thus cannot be reduced any more, the process is ended (S180). Thereafter, a bus bar pattern corresponding to a minimum value among AC losses calculated repeatedly is determined as a final pattern. That is, a shape of a bus bar consisting of the determined N−1 or N sub-bars having the height H and the width W1 to W[N−1] or W1 to WN is finally determined.

According to the present disclosure, basically, a structure of a horizontal array type bus bar can be improved to minimize an AC loss, compared to a single bus winding, and to fix imbalance in current between sub-bars. An effect of heat dissipation using a single cooling channel can be maintained constant, as in a horizontal array type bus bar of the related art. Accordingly, it is not necessary to configure a low-voltage high-current winding using a Litz wire, thus reducing costs, and a bus bar with a certain pattern can be mass-produced after designing the same (which can be simply mass-produced using a mold). Furthermore, a bus bar is designed according to standard requirements of a core and thus utilization of a window space inside the core can be maximized.

While the present disclosure has been described above in detail with respect to embodiments, it will be understood by those of ordinary skill in the art that the present disclosure can be embodied in many different forms without departing from the technical idea or essential features of the present disclosure. Accordingly, the embodiments set forth herein should be considered only as examples and not for purposes of limitation. The scope of the present disclosure is defined by the following claims other than the detailed description, and all changes or modifications derivable from the claims and their equivalents should be construed as being included in the technical scope of the present disclosure.

What is claimed is:

1. A bus bar provided as a winding around a center leg of a core of a transformer, the bus bar comprising multiple sub-bars arranged horizontally and connected in parallel,
    wherein the multiple sub-bars are horizontally arranged, surrounding the center leg, and a respective sub-bar has a width in a horizontal direction,
    wherein the multiple sub-bars comprise an inner sub-bar being closer to the center leg of the core and an outer sub-bar being located at an outer side of the inner sub-bar,
    wherein the width of the inner sub-bar is less than that of the outer sub-bar,
    wherein the inner sub-bar comprises a first end and a second end, both of which are disconnected,
    wherein the outer sub-bar comprises a first end and a second end, both of which are disconnected, and
    wherein the first end of the inner sub-bar and the first end of the outer sub-bar are bonded to each other, and the second end of the inner sub-bar and the second end of the outer sub-bar are bonded to each other.

2. The bus bar of claim 1, wherein, among the multiple sub-bars, a width of a longer sub-bar is greater than that of a shorter sub-bar.

3. The bus bar of claim 1, wherein the multiple sub-bars are accommodated in a window of the core.

4. A method of designing a bus bar of a transformer, which includes multiple sub-bars arranged horizontally to share a current flowing through the bus bar included as a winding in a core of the transformer, the method comprising:
    (1) calculating a height H of the bus bar and a length L1 of a center sub-bar, which is an innermost sub-bar, in a space of the core;
    (2) selecting an initial width W1 of the center sub-bar;
    (3) calculating a width W2 of a subsequent sub-bar adjacent to the center sub-bar;
    (4) calculating up to a width WN of an $N^{th}$ sub-bar while checking whether a sum of widths of the sub-bars, distances between the sub-bars, and a distance G to a structure <a width CW of the core, i.e., whether SUM[W1+W2+ . . . +WN+G*(N+1)]<CW, wherein when SUM[W1+W2+ . . . +WN+G*(N+1)]<CW, this operation (4) is continuously performed;
    (5) when it is determined in operation (4) that SUM[W1+W2+ . . . +WN+G*(N+1)]>CW, calculating an alternating-current (AC) loss with respect to the bus bar including the calculated sub-bars, excluding the $N^{th}$ sub-bar calculated last;
    (6) repeatedly performing operations (1) to (5) while changing the initial width W1 by a predetermined rate of change ΔW1 until the initial width W1 of the center sub-bar becomes equal to an allowable minimum value W1_min; and
    (7) when the initial width W1 of the center sub-bar becomes equal to the allowable minimum value W1_min, determining the bus bar to include sub-bars corresponding to a minimum value among AC losses obtained by repeated calculation.

5. The method of claim 4, wherein, in operation (1), the height H of the bus bar is calculated according to the current flowing through the bus bar.

6. The method of claim 4, wherein, in operation (1), the length L1 of the center sub-bar is calculated by a length CD of the core and a radius CR of a center leg of the core.

7. The method of claim 4, wherein, in operation (3), the width W2 of the subsequent sub-bar is calculated according to the length L1 of the center sub-bar, a length L2 of the subsequent sub-bar, and a resistance of each of the sub-bars.

8. The method of claim 4, wherein, in operation (5), when SUM[W1+W2+ . . . +WN+G*(N+1)]=CW, the $N^{th}$ sub-bar calculated last is included in a configuration of the bus bar.

9. A transformer of a DC-DC converter used in a vehicle, the transformer comprising a bus bar provided as a winding around a center leg of a core of the transformer and including multiple sub-bars arranged horizontally and connected in parallel,
    wherein the multiple sub-bars are horizontally arranged, surrounding the center leg, and a respective sub-bar has a width in a horizontal direction,
    wherein the multiple sub-bars comprise an inner sub-bar being closer to the center leg of the core and an outer sub-bar being located at an outer side of the inner sub-bar,
    wherein the width of the inner sub-bar is less than that of the outer sub-bar,
    wherein the inner sub-bar comprises a first end and a second end, both of which are disconnected,
    wherein the outer sub-bar comprises a first end and a second end, both of which are disconnected, and
    wherein the first end of the inner sub-bar and the first end of the outer sub-bar are bonded to each other, and the second end of the inner sub-bar and the second end of the outer sub-bar are bonded to each other.

10. The transformer of claim 9, wherein, among the multiple sub-bars included in the bus bar, a width of a longer sub-bar is greater than that of a shorter sub-bar.

11. The transformer of claim 9, wherein the bus bar is determined by:
    (1) calculating a height H of the bus bar and a length L1 of a center sub-bar, which is an innermost sub-bar, in a space of the core;
    (2) selecting an initial width W1 of the center sub-bar;
    (3) calculating a width W2 of a subsequent sub-bar adjacent to the center sub-bar;
    (4) calculating up to a width WN of an $N^{th}$ sub-bar while checking whether the sum of widths of the sub-bars, distances between the sub-bars, and a distance G to a structure <a width CW of the core, i.e., whether SUM[W1+W2+ . . . +WN+G*(N+1)]<CW, wherein when SUM[W1+W2+ . . . +WN+G*(N+1)]<CW, operation (4) is continuously performed;
    (5) when it is determined in operation (4) that SUM[W1+W2+ . . . +WN+G*(N+1)]>CW, calculating an alternating-current (AC) loss with respect to the bus bar including the calculated sub-bars, excluding the $N^{th}$ sub-bar calculated last;

(6) repeatedly performing operations (1) to (5) while changing the initial width W1 by a predetermined rate of change ΔW1 until the initial width W1 of the center sub-bar becomes equal to an allowable minimum value W1_min; and
(7) when the initial width W1 of the center sub-bar becomes equal to the allowable minimum value W1_min, determining the bus bar to include sub-bars corresponding to a minimum value among AC losses obtained by repeated calculation.

* * * * *